United States Patent
Hall et al.

(10) Patent No.: US 9,210,257 B2
(45) Date of Patent: Dec. 8, 2015

(54) SYSTEMS AND METHODS EMPLOYING TIME DOMAIN REFLECTOMETRY

(75) Inventors: Nelson Hall, Kent, WA (US); Keith Lanan, Renton, WA (US); Oscar E. Morel, Seattle, WA (US)

(73) Assignee: UTILX Corporation, Kent, WA (US)

( * ) Notice: Subject to any disclaimer, the term of this patent is extended or adjusted under 35 U.S.C. 154(b) by 1020 days.

(21) Appl. No.: 13/157,227

(22) Filed: Jun. 9, 2011

(65) Prior Publication Data

US 2011/0304340 A1   Dec. 15, 2011

Related U.S. Application Data

(60) Provisional application No. 61/354,612, filed on Jun. 14, 2010, provisional application No. 61/354,101, filed on Jun. 11, 2010.

(51) Int. Cl.
  *G01R 31/11*   (2006.01)
  *H04M 3/30*    (2006.01)
  *H04B 3/46*    (2015.01)
  *G01R 27/06*   (2006.01)

(52) U.S. Cl.
  CPC ............... *H04M 3/306* (2013.01); *G01R 31/11* (2013.01); *H04B 3/46* (2013.01); *G01R 27/06* (2013.01)

(58) Field of Classification Search
  CPC ............... G01R 27/06; G01R 29/0878; G01R 31/1232; H04M 3/306
  USPC ......... 324/521–535, 500, 602–612, 667, 676, 324/674, 709–713, 600; 428/412
  See application file for complete search history.

(56) References Cited

U.S. PATENT DOCUMENTS

| | | | |
|---|---|---|---|
| 3,727,128 A | 4/1973 | McFerrin | |
| 7,276,914 B2 * | 10/2007 | Li | ................. 324/534 |
| 7,906,973 B1 | 3/2011 | Orr | |
| 2002/0123350 A1 | 9/2002 | Bui | |

(Continued)

FOREIGN PATENT DOCUMENTS

| | | |
|---|---|---|
| DE | 2 147 200 | 4/1972 |
| DE | 26 44 157 A1 | 4/1978 |
| DE | 39 29 990 C1 | 7/1990 |

OTHER PUBLICATIONS

Search Report mailed Sep. 30, 2011, in corresponding Great Britain Patent Application No. GB1109692.2.
Office Action mailed Aug. 30, 2013, issued in corresponding German Application No. 10 2011 077 262.2 filed Jun. 10, 2011, 13 pages.
Office Action mailed Feb. 10, 2015, issued in corresponding British Application No. 1109692.2 filed Jun. 9, 2011, 3 pages.

*Primary Examiner* — Melissa Koval
*Assistant Examiner* — Trung Nguyen
(74) *Attorney, Agent, or Firm* — Christensen O'Connor Johnson Kindness PLLC

(57) ABSTRACT

Methods of testing at least a transmission line of interest within a group of transmission lines for anomalies using Time Domain Reflectometry are provided. The testing methods set forth herein aim to improve, for example, the quality and accuracy of information collected when propagating signals along a length of transmission line in order to pinpoint specific anomalies. To achieve this and other benefits, the testing methods simultaneously impose, for example, pulses of equal magnitude and form onto a group of transmission lines, such as the phases cables of a three phase power transmission cable system. From this, at least one transmission line from the group is monitored for reflected signals caused by impedance change. An example TDR is also provided.

11 Claims, 5 Drawing Sheets

(56) References Cited

U.S. PATENT DOCUMENTS

| | | | |
|---|---|---|---|
| 2003/0118832 A1* | 6/2003 | Skaling et al. | 428/412 |
| 2009/0081435 A1* | 3/2009 | Gottfried et al. | 428/219 |
| 2010/0141264 A1 | 6/2010 | Ravot | |
| 2012/0086459 A1* | 4/2012 | Kim | 324/522 |
| 2013/0234731 A1* | 9/2013 | Tziouvaras | 324/658 |

OTHER PUBLICATIONS

Office Action mailed Nov. 20, 2014, issued in corresponding British Application No. 1109692.2 filed Jun. 9, 2011, 5 pages.

Office Action mailed Jun. 23, 2014, issued in corresponding Canadian Application No. 2,742,667 filed Jun. 9, 2011, 3 pages.

* cited by examiner

SYSTEMS AND METHODS EMPLOYING TIME DOMAIN REFLECTOMETRY

CROSS-REFERENCES TO RELATED APPLICATIONS

This application claims the benefit of U.S. Provisional Application Nos. 61/354,101, filed Jun. 11, 2010, and 61/354,612, filed Jun. 14, 2010, the disclosures of which are expressly incorporated by reference herein.

BACKGROUND

A Time Domain Reflectometer (TDR) is one apparatus that can be used to analyze a traditional transmission line, such as a telephone line or power cable, for anomalies, such as splices, faults, neutral corrosion, water damage, etc. TDRs are capable of analyzing the transmission line for changes in impedance in order to locate such anomalies. A typical TDR transmits a pulse of electrical energy onto a transmission line. When the pulse encounters a change in the impedance of the transmission line, part of the pulse's energy is reflected back toward the TDR. The amplitude and polarity of this reflection is proportional to the change in impedance. Such reflections are usually displayed in graphical form on the screen of a typical TDR whereby a technician can interpret the results and locate specific transmission line anomalies. In particular, the time of propagation of the pulse as well as the pulse shape can be used to identify and locate the anomaly along the transmission line.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In accordance with aspects of the present disclosure, a method of testing a transmission line for an anomaly is provided. The method comprises providing a group of parallely extending transmission lines. Each of the transmission lines comprise first and second conductors. The group of parallely extending transmission lines include a test transmission line and one or more associated transmission lines. The method also includes generating at least one test pulse of energy and simultaneously imposing the at least one test pulse of energy onto the test transmission line and the one or more associated transmission lines. The pulses imposed onto the transmission lines have equal magnitude and form and travel along the transmission line's length. The method further includes receiving at least one reflected signal from at least the test transmission line. The at least one reflected signal results from the test pulse interfacing with an anomaly along the test transmission line.

In accordance with another aspect of the present disclosure, a method of testing a transmission line for a change in impedance is provided. The method comprises providing a group of parallely extending transmission lines, wherein each transmission line comprises first and second conductors. The group of parallely extending transmission lines includes a test transmission line and one or more associated transmission lines. The method also includes generating at least one test pulse of energy, splitting each of the at least one test pulses into a number of test pulses of equal magnitude and form, and thereafter, simultaneously imposing the test pulses of energy onto the test transmission line and the one or more associated transmission lines. The test pulses imposed onto the transmission lines have equal magnitude and form and travel along the transmission line's length. The method further includes receiving a reflected signal from at least the test transmission line, wherein the reflected signal resulting from an impedance change along the length of the test transmission line, and sensing at least one characteristic of the reflected signal.

In accordance with another aspect of the present disclosure, an apparatus is provided for testing a transmission line for a change in impedance within a group of parallely extending transmission lines. Each transmission line of the group comprises first and second conductors. The group of parallely extending transmission lines includes a test transmission line and at least one associated transmission line. The apparatus comprises a computing device, a pulse generator that generates at least one pulse upon reception of a command signal from the computing device, a splitter that receives the at least one pulse from the pulse generator and splits each of the least one pulse into a number of pulses of equal magnitude and form, and couplings that connect the splitter to the conductor pairs of the test transmission line and at least one associated transmission line. The couplings are capable of simultaneously imposing the number of pulses received from the splitter onto the conductor pairs of the test transmission line and the conductor pairs of the at least one associated transmission line. The apparatus further includes at least one sensor associated with the test transmission line. The sensor is capable of sensing a reflected signal resulting from an impedance change along the length of the test transmission line and outputting a signal indicative thereof to the computing device.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

Figure 1:
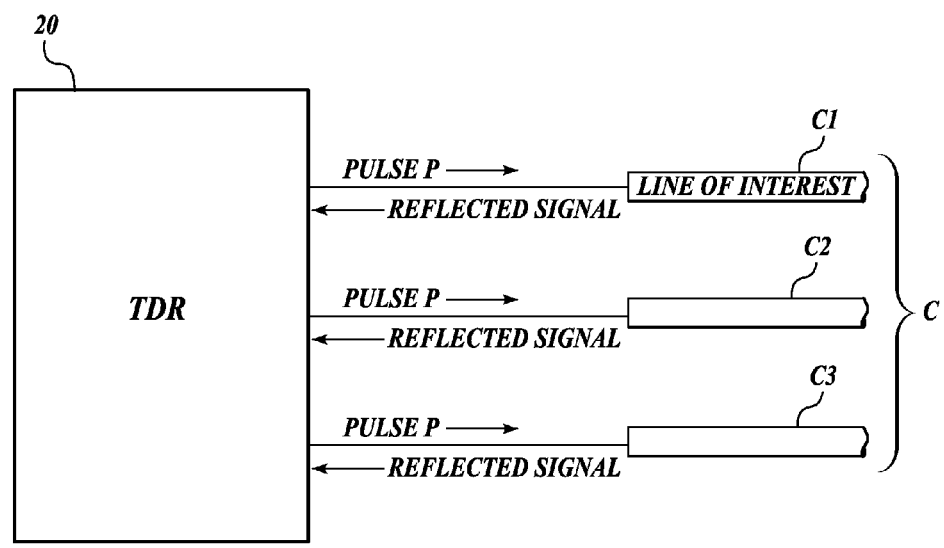
FIG. 1 is a schematic diagram of one environment in which methods of the present disclosure may be implemented.

The detailed description set forth below in connection with the appended drawings where like numerals reference like elements is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the disclosure to the precise forms disclosed. Similarly, any steps described herein may be interchangeable with other steps, or combinations of steps, in order to achieve the same or substantially similar result.

The following discussion proceeds with reference to examples of transmission line testing methods and systems. As used herein, transmission lines include any material medium or structure that forms a path for directing the transmission of energy from one place to another, such as electromagnetic waves or electric power transmission. Several examples of the testing systems and methods set forth herein utilize Time Domain Reflectometers (TDRs) for testing, and potentially analyzing, transmission lines for the presence of anomalies.

As described herein, a Time Domain Reflectometer (TDR) transmits a transient of electrical energy, such as pulse of electrical energy, onto a transmission line. In some embodiments, the transmission line is a power transmission cable or coaxial cable that includes two conductors, a central conductor and a neutral conductor, separated by a dielectric media, such as polyethylene, cross linked polyethylene or XLPE, PTFE, air or other gas, etc. In other embodiments, the transmission line is a twisted pair cable that includes a forward conductor and a return conductor separated by one or more insulative media (e.g., insulation, air, etc.). It will be appreciated that other two conductor transmission lines may be tested using methods and systems described herein.

When the electrical pulse encounters an impedance change along the transmission line's length, part of the pulse's energy is reflected back toward the TDR. By measuring, for example, the amplitude and/or polarity of the reflected signal, the proportionality of the impedance change can be determined. Additionally, by measuring the time of propagation of the pulse, the location of the impedance change can also be determined. Typical anomalies that will cause an impedance change include but are not limited to a change in the transmission line medium, cross talk, water or other fluid ingress, splices, faults, neutral corrosion, water damage to the insulation and/or shield, and damage to the cable (e.g., broken conductors, shorted conductors, smashed, crushed, pinched or kinked transmission lines, cuts, etc.), and the like.

While several examples set forth herein will describe a representative TDR and associated methods that are capable of testing a three-phase power transmission cable, it will be appreciated that aspects of the present disclosure have wide application, and therefore, may be suitable for testing any grouping (i.e., two or more) of parallely extending transmission lines, including but not limited to twisted pair cable, standard coaxial cable (RG-6, RG-60, etc.) and/or the like. Accordingly, the following descriptions and illustrations herein should be considered illustrative in nature, and thus, not limiting the scope of the claimed subject matter.

Some embodiments of the present disclosure may provide for a TDR and/or method that tests an "off-line" or "de-energized" transmission line. In other embodiments, the TDR and/or method can be used to test an "on-line" or "energized" transmission lines. In this way, technicians do not need to take the transmission line "off line" nor do they need access to the transmission line's inner conductor.

In the following description, numerous specific details are set forth in order to provide a thorough understanding of exemplary embodiments of the present disclosure. It will be apparent to one skilled in the art, however, that many embodiments of the present disclosure may be practiced without some or all of the specific details. In some instances, well-known process steps have not been described in detail in order not to unnecessarily obscure various aspects of the present disclosure. Further, it will be appreciated that embodiments of the present disclosure may employ any combination of features described herein.

In accordance with several embodiments of the present disclosure, methods of testing at least a transmission line of interest within a group of transmission lines for anomalies using Time Domain Reflectometry are provided. In that regard, the testing methods set forth herein aim to improve, for example, the quality and accuracy of information collected when propagating signals along a length of transmission line in order to pinpoint specific anomalies.

Turning now to the embodiment shown in FIG. 1, testing methods of the present disclosure may be carried out with the use of a TDR 20. As will be described in more detail below, the TDR 20 is capable of testing and/or analyzing a transmission line of interest from a group of two or more transmission lines. One exemplary testing method begins by suitably connecting the TDR 20 in electrical communication with two or more transmission lines comprising the test transmission line, sometimes referred to as the transmission line of interest, and one or more associated, or secondary, transmission lines. In embodiments herein, the associated transmission lines typically run in parallel with the transmission line of interest, and are located in close enough proximity to the transmission line of interest so as to allow measurable electromechanical linkage therebetween.

Figure 2A:
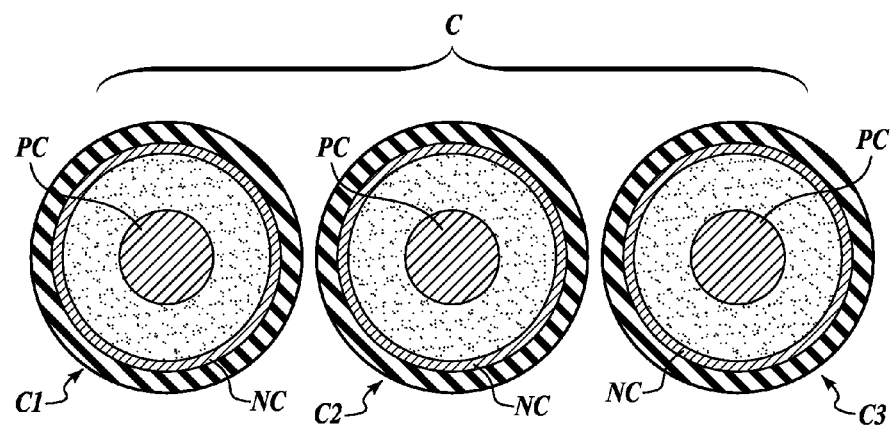
FIGS. 2A-2C are cross-section views of exemplary transmission lines, such as three phase power transmission cables, that may be tested and/or analyzed by embodiments of the present disclosure.
Figure 2B:
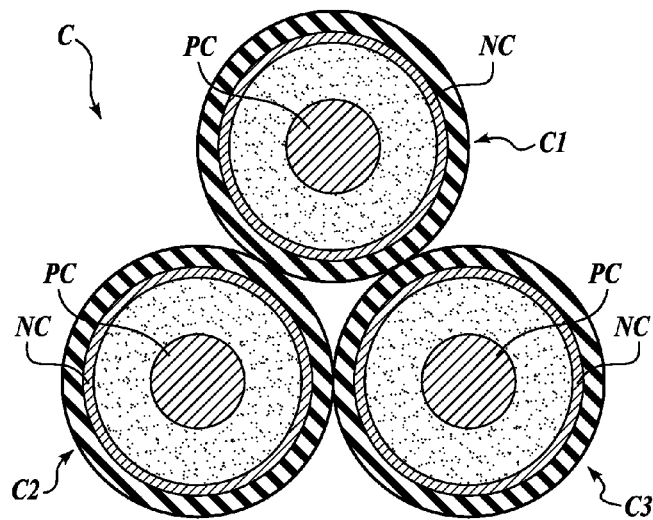
Figure 2C:
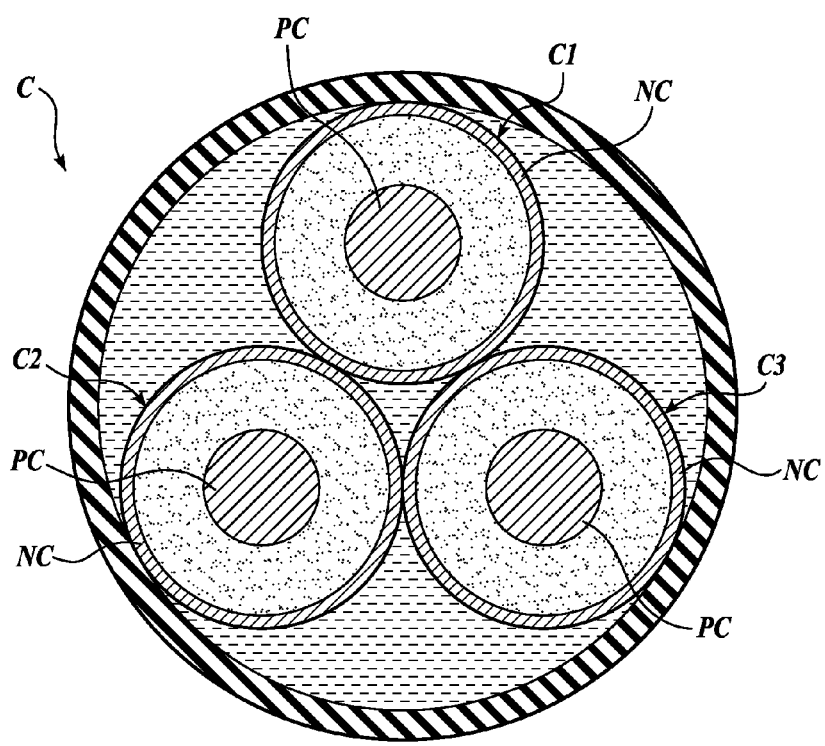

In the embodiment shown in FIG. 1, the two or more transmission lines include the test phase cable C1 of a power transmission cable C and the associated or secondary phase cables C2 and C3 of a power transmission cable C. In several embodiments, the power transmission cable C is capable of transmitting, for example, 50 Hz or 60 Hz frequency, three-phase power. The three-phase power transmission cable C can be of the type known as 3×1 core, triplex, or 3-core, as best shown in FIGS. 2A-2C, respectively. Each phase cable C1-C3 includes a phase conductor PC and a neutral conductor NC. In this embodiment, the TDR 20 can be coupled to the phase conductor PC and neutral conductor NC of each phase cable, as will be described in more detail below.

Once connected, the TDR 20 generates at least one transient of energy, such as a pulse of energy P, that is simultaneously imposed onto each phase cable C1-C3. The imposed pulses P then travel along each phase cable C1-C3 of the power transmission cable C. As the pulses P travel along each phase cable C1-C3 of the power transmission cable C, at least the test phase cable C may be monitored by, for example, the TDR 20, for the presence of any reflected signals caused by the pulse P encountering an anomaly along the phase cable's length. For example, if the pulse P encounters a change in impedance as it propagates down the test phase cable C1, a reflection signal RS is produced.

It will be appreciated that the reflection signal RS travels in the opposite direction as the imposed pulse P and is transmitted back to the TDR 20. At the TDR 20, the reflection signal RS associated with the test phase cable C1 is sensed (e.g., measured), processed, and optionally displayed on an associated or integrated display. The reflection signal RS, or data indicative thereof, may also be stored for further analysis, if desired. In one embodiment, the reflection signals RS sensed by the TDR 20 may be analyzed to determine the location of the anomaly, the type of the anomaly, etc.

In embodiments of the present disclosure, one or more of the associated or secondary transmission lines, such as phase cables C2 and/or C3 also may be monitored for reflected signals caused by anomalies. In these embodiments, the reflection signal RS associated with the secondary phase cables C2 and/or C3 are sensed (e.g., measured), processed, and stored for further analysis and/or display, if desired.

The TDR testing methods described above realize several benefits over the prior art. In that regard, a discussion of a prior art TDR method will now be described. TDR testing methods prior to the present disclosure employed only a single TDR probe to impose a pulse solely onto a single phase cable (hereinafter the "tested phase cable") of a three phase cable system. It should be noted that certain characteristics of conventional insulated transmission lines can reduce the effectiveness of this prior art TDR method. For example, a transmission line's characteristic impedance has a tendency to attenuate the signal below noise levels. Additionally, the transmission line's external shielding can be susceptible to signal leakage, which reduce the signal strength of a pulse as it travels along the transmission line's length.

The inventors of the disclosed subject matter also recognized an additional complication attributable to external shield leaks. In particular, the inventors recognized that when the tested transmission line is a part of a parallely extending group of transmission lines, such as a three phase power transmission cable configuration as described above with reference to FIGS. 2A-2C, a leaking signal may be impressed onto the tested transmission line from the other transmission lines of the group, such as the other phase cables of the three phase cable system. Those impressed signals will then travel independently along a variety of different pathways on their new 'hosts'. Each of those paths may have different characteristic velocities of propagation, and all of those pulses may feedback onto the tested phase cable, thereby creating interpretation difficulties.

To solve these problems and others, the inventors recognized that trying to keep all of, or as much as possible, the original pulse energy traveling along the intended path would provide several advantages over the prior art TDR methods. First, it keeps the original pulse energy focused along the transmission line of interest, so that all of that energy is available to combat the transmission line's attenuating properties. Second, it eliminates the confusion caused by multiple reflections from alternative pulse pathways. These and other benefits and advantages can be realized by embodiments of the TDRs and methods described herein that simultaneously impose, for example, pulses of equal magnitude and form onto a group of transmission lines, such as the phases cables of a three phase power transmission cable system. As a result, it is believed that the geometrical balance of potential along the three phase cable lengths either inhibits, restricts or substantially reduces the likelihood of a transfer of energy from one phase cable to another, thereby keeping the full pulse energy of each individual pulse traveling along its intended cable path.

Figure 4:
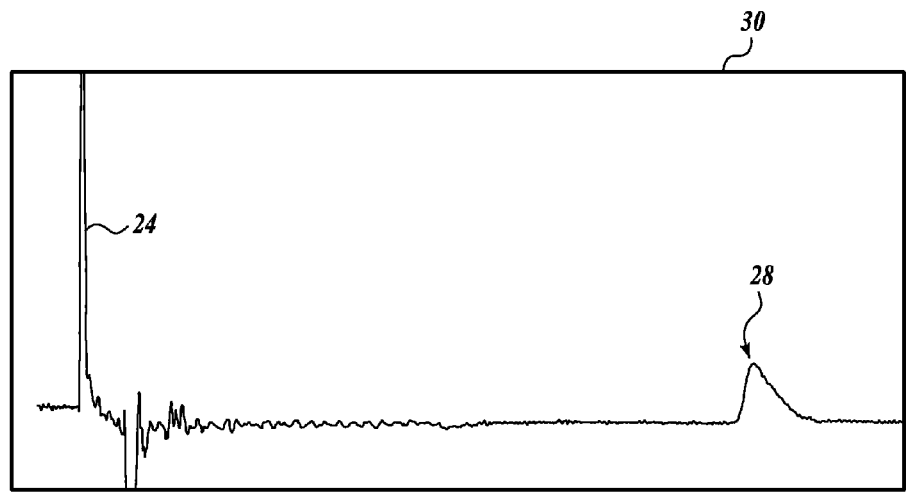
FIG. 4 illustrates a TDR trace generated by simultaneously imposing a signal pulse onto each phase cable of a three phase cable system using a TDR constructed in accordance with aspects of the present disclosure.
Figure 5:
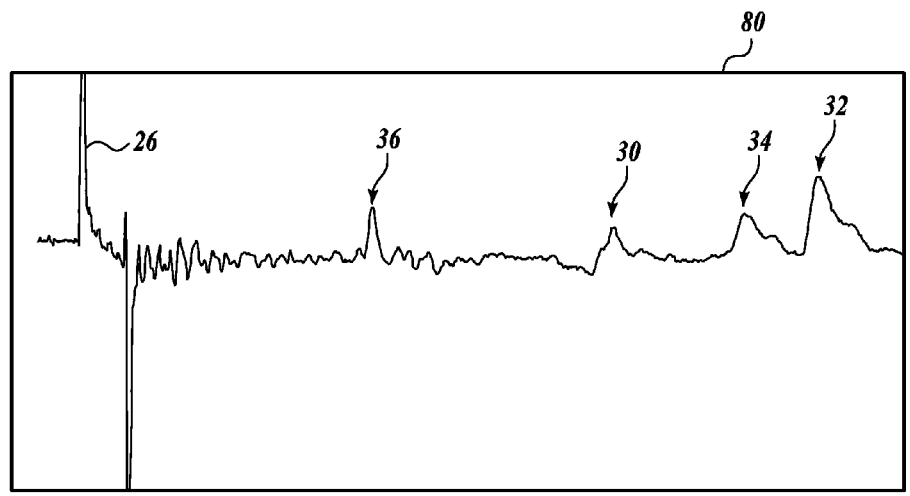
FIG. 5 illustrates a TDR trace generated by a single pulse transmitted onto only one phase cable of a three phase cable system.

An example of the aforementioned advantages is demonstrated by reference to FIGS. 4 and 5. FIG. 5 illustrates a TDR trace 24 generated by prior art TDR methods of a single pulse transmitted onto only one phase cable (the tested phase cable) of a three phase cable system. In contrast, FIG. 4 illustrates a TDR trace 26 generated by simultaneously imposing a signal pulse onto each phase cable of the same three phase cable system employed with the prior art TDR methods using methods in accordance with aspects of the present disclosure.

In FIG. 5, the trace 24 depicts only one significant bump or blip 28 on the right hand side of the data trace. This bump or blip 28 is caused by the reflection signal that occurs at the cable end. In contrast, the right hand side of the trace 26 depicted in FIG. 4 shows erroneous reflections 30 and 32 both ahead of and behind the reflection signal 34, respectively, that represents the impedance change at the end of the cable. The trace 26 also shows some reflection signals 36 towards the middle left of the trace 26. The signal reflections 30, 32, and 36 are all erroneous as they are caused by signals cross talking with the other phases of this three (3) phase cable system. In some cases, the bleed over pulse energy finds faster pathways to travel and in other cases, slower pathways. The false signals will decrease in magnitude as the adjacent phases are moved farther away from the original phase target.

Figure 3:
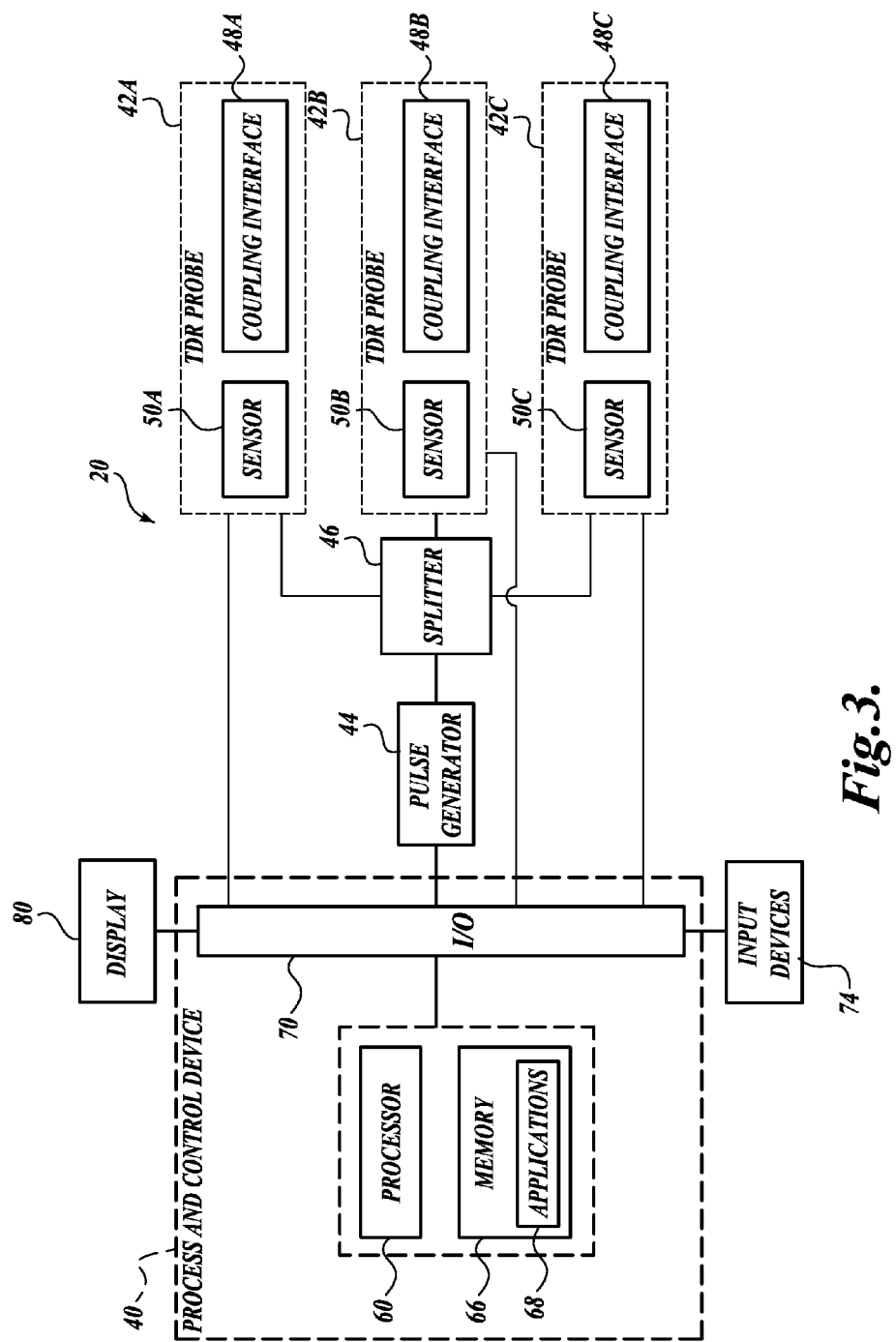
FIG. 3 is a block diagram of one embodiment of a TDR formed in accordance with aspects of the present disclosure.

Turning now to FIG. 3, one example of a TDR 20 that may be used for carrying out one or more methods set forth herein will now be described. As best shown in FIG. 3, the TDR 20 includes a process and control device 40, a number of couplings, such as TDR probes 42A-42C, capable of electrically coupling with the two conductors of the transmission line, and a pulse generator 44 that receives commands from the process and control device 40, and as a result, generates one or more sequential pulses of energy for output to the TDR probes 42. In one embodiment, the sequential pulses may have a selectable pulse width of 2, 10, 100, 1000, 2000, 4000, and 6000 nsec, among others. The TDR 20 may further include a splitter 46 that receives the generated pulse(s) from the pulse generator 44, splits the pulse(s) into a number of pulses of equal magnitude and form as the original pulse generated by the pulse generator 44, and transmits the pulse(s) split by the splitter 46 to the two or more TDR probes 42. It will be appreciated that the splitter 46 is configured to split the pulse(s) into a number of pulses either corresponding to or greater than the number of TDR probes 42.

Each TDR probe 42 includes a transmission line coupling interface 48 for connecting electrically to a corresponding transmission line. In one embodiment, the coupling interface 48 is configured for electrical connection with the phase conductor and the neutral conductor of a phase cable. In these embodiments and others, the coupling interface 48 may be in the form of alligator clips or the like. The TDR probes 42 may also include suitable connectors, such as banana jacks, coaxial connectors, etc. or combinations thereof, for interfacing with the pulse generator 44 and/or the process and control device 40. The TDR probes 42 may be portable probes for in-field data acquisition and/or testing or configured to be fixed in place at a termination location, such as a termination elbow. In use, as briefly described above, the probes 42 transmit pulses of energy generated by the pulse generator 44 onto the transmission lines, and then receive any reflected signals of the transmitted pulses caused by anomalies.

In one embodiment, the TDR probe 42A associated with the transmission line of interest (the tested transmission line) may also include a sensor 50. In other embodiments, each TDR probe 42 includes a sensor 50. In either case, the sensor(s) 50 is capable of sensing the received reflection signals caused by anomalies, and transmitting these signals and/or measurement signals thereof to the process and control device 40 for processing, displaying, and/or storing, etc. In an alternative embodiment, the sensors 50 may be discrete from the TDR probes 42. In some embodiments, the sensor 50 is also capable of sensing when the pulse of energy is generated by the pulse generator as well as measuring at least one characteristic (e.g. voltage, etc.) of the test pulse and outputting the results to the process and control device 40 for processing and/or storage.

Still referring to FIG. 3, the process and control device 40 includes a processor 60, a memory 66, and I/O circuitry 70. The memory 66 may include read only memory (ROM), random access memory (RAM), and storage memory. Examples of ROM include a programmable ROM (PROM), an erasable programmable ROM (EPROM), and an electrically erasable PROM (EEPROM). Examples of storage memory include flash memory, a hard disk drive, etc. The storage memory and their associated computer-readable media provide non-volatile storage of computer readable instructions, data structures, program modules, and data received from the sensors 50. As used herein, the term processor is not limited to integrated circuits referred to in the art as a computer, but broadly refers to a microcontroller, a microcomputer, a microprocessor, a programmable logic controller, an application specific integrated circuit, and other programmable circuits, among others.

A number of program modules may be stored in storage memory, including one or more application programs 68, and program data. One application program generates a control signal to be transmitted to the pulse generator 44 to instruct the pulse generator 44 to generate one or more sequential pulses of energy. In some embodiments, the control signal could be simply a trigger signal. This application or a separate application may keep track of the time between the generation of the pulse(s) and the reception of any reflection signals, sometimes referred to as the time of propagation. This time of propagation can be used to calculate the velocity of propagation, if desired.

A technician may enter commands and information through input devices 74 such as a keyboard, joystick, potentiometers, switches, etc. The signals processed by the process and control device 40 may be displayed on display 80. It will be appreciated that the process and control device 40, the pulse generator 44, and in some embodiments, the sensor(s) 50 and/or the splitter 46 may be constructed as a unitary handheld device. One apparatus, or components thereof, that may be practiced with embodiments of the present disclosure is the TDR sold under the Riser Bond brand, model number 1205CXA.

The operation of the TDR 20 according to one embodiment will now be described. In use, when the one or more applications are implemented, either manually by input from a technician or automatically via instructions by the processor 60 (e.g., time based instructions) one or more pulses are generated by the pulse generator 44. The pulse(s) from the pulse generator 44 are then transmitted to the splitter 46, which splits the pulse(s) and transmits pulses of equal magnitude and form to the TDR probes 42A-42C. The TDR probes, in turn, receive the pulses from the splitter 46 and impose the pulses onto the transmission lines, such as phase cables C1-C3. At least the sensor 50A associated with the TDR probe connected to the tested transmission line then detects any reflection signal of the propagating pulse, which occurs due to a change in impedance on the phase cable. Any reflected signals sensed by the sensor 50A, or in some embodiments, sensed by more than one of the sensors 50A-C, are transmitted back to the processor 60 via the I/O circuitry 70. As the wave reflections are detected, optionally measured, and transmitted to the processor 60 by at least the sensor 50A, the one or more applications receive pulse information from reflected signals and assimilate the information to be displayed in a graphical representation on the display 80. The technician of the TDR 20 is then able to interpret information from the graphical representation of the anomalies detected on at least the tested transmission line of the power transmission cable C.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the claimed subject matter.

The embodiments of the invention in which an exclusive property or privilege is claimed are defined as follows:

1. A method of testing a transmission line for an anomaly, comprising:
    providing a group of parallely extending transmission lines, each transmission line comprising first and second conductors, the group of parallely extending transmission lines including a test transmission line and one or more associated transmission lines;
    generating at least one test pulse of energy;
    simultaneously imposing the at least one test pulse of energy onto the test transmission line and the one or more associated transmission lines, the pulses imposed onto the transmission lines having equal magnitude and form and travel along the transmission line's length; and
    receiving at least one reflected signal from at least the test transmission line, the at least one reflected signal resulting from the test pulse interfacing with an anomaly along the test transmission line;
    wherein the test transmission line is a single phase of a multi-phase power transmission cable and the one or more associated transmission lines comprise the remaining phases of the multi-phase power transmission cable.

2. The method of claim 1, further comprising
    measuring the at least one reflected signal from at least the test transmission line.

3. The method of claim 1, wherein the one or more associated transmission lines extend generally parallel with the test transmission line, and are located in such proximity to the test transmission line so as to allow measurable electrical coupling therebetween.

4. The method of claim 3, wherein the simultaneously imposed pulses on the one or more associated transmission lines resist electrical coupling interference and signal strength loss of the test pulse traveling along the test transmission line.

5. The method of claim 1, wherein the remaining phases of the multi-phase power transmission cable are in such proximity as to allow electrical coupling to the test transmission line.

6. The method of claim 1, further comprising
    displaying the at least one reflected signal from the test transmission line on a display in the time domain.

7. The method of claim 1, further comprising
    storing data indicative of the at least one received reflected signal.

8. The method of claim 1, simultaneously receiving data indicative of reflected signals for each transmission line of the group of parallely extending transmission lines.

9. The method of claim 1, further comprising
    splitting the test pulse of energy prior to imposing the test pulse of energy onto the test transmission line and the one or more associated transmission lines.

10. An apparatus for testing a transmission line for a change in impedance within a group of parallely extending transmission lines, wherein each transmission line comprising first and second conductors, the group of parallely extending transmission lines including a test transmission line and at least one associated transmission line, the apparatus comprising:

a computing device;

a pulse generator that generates at least one pulse upon reception of a command signal from the computing device;

a splitter that receives the at least one pulse from the pulse generator and splits each of the least one pulse into a number of pulses of equal magnitude and form;

couplings that connect the splitter to the conductor pairs of the test transmission line and at least one associated transmission line, the couplings being capable of simultaneously imposing the number of pulses received from the splitter onto the conductor pairs of the test transmission line and the conductor pairs of the at least one associated transmission line; and at least one sensor associated with the test transmission line, the sensor capable of sensing a reflected signal resulting from an impedance change along the length of the test transmission line and outputting a signal indicative thereof to the computing device;

wherein the test transmission line is a single phase of a multi-phase power transmission cable and the at least one associated transmission line comprises the remaining phases of the multi-phase power transmission cable.

11. The apparatus of claim 10, wherein the sensor is also capable of sensing the time and/or magnitude of the at least one pulse generated by the pulse generator.

* * * * *